United States Patent [19]

Svedberg

[11] 4,224,634
[45] Sep. 23, 1980

[54] EXTERNALLY CONTROLLED SEMICONDUCTOR DEVICES WITH INTEGRAL THYRISTOR AND BRIDGING FET COMPONENTS

[75] Inventor: Per Svedberg, Vällingby, Sweden

[73] Assignee: ASEA Aktiebolag, Vesteras, Sweden

[21] Appl. No.: 691,618

[22] Filed: Jun. 1, 1976

[30] Foreign Application Priority Data

Jun. 19, 1975 [SE] Sweden .............................. 7507080

[51] Int. Cl.² ....................................... H01L 29/74
[52] U.S. Cl. ....................................... 357/38; 357/23; 357/30; 357/39; 357/43; 357/86; 307/252 C
[58] Field of Search ................ 357/38, 30, 22, 42, 357/43, 39, 238 C; 307/252 C, 238

[56] References Cited

U.S. PATENT DOCUMENTS

| | | | |
|---|---|---|---|
| 2,655,610 | 10/1953 | Ebers | 357/38 |
| 3,271,700 | 9/1966 | Gutzwiller | 307/252 C |
| 3,366,802 | 1/1968 | Hilbiber | 357/22 |
| 3,564,291 | 2/1971 | Aagard | 357/38 |
| 3,702,990 | 11/1972 | Ross | 307/238 |
| 3,719,863 | 3/1973 | Ogawa et al. | 357/38 |
| 3,812,405 | 5/1974 | Clark | 357/38 |
| 4,012,762 | 3/1977 | Abe et al. | 357/23 |

OTHER PUBLICATIONS

H. Eng., "The Field Effect Controlled Switch," Microelectronics, vol 3, #7, Jul. 1970, pp. 36-38.

*Primary Examiner*—Joseph E. Clawson, Jr.
*Attorney, Agent, or Firm*—Watson, Cole, Grindle & Watson

[57] ABSTRACT

A semi-conductor device includes a semi-conductor body with four layers of alternate P and N conducting types, these layers constituting a thyristor whose outermost layers form emitter junctions with adjacent layers. The semi-conductor body also includes an integrated field effect transistor part for bridging one of the emitter junctions of the thyristor. The source and drain of the field effect transistor include regions of the same conductivity type, one of which forms the emitter layer adjacent to the bridged emitter junction and the other of which comprises a region ohmically connected to the layer adjacent to the emitter layer and of the same type of conductivity as the emitter layer.

The field effect transistor has a control electrode and a protective diode is provided in the semi-conductor body for limiting voltage between the control electrode of the field effect transistor and the semi-conductor body. The thyristor is arranged for optical ignition.

7 Claims, 9 Drawing Figures

4,224,634

EXTERNALLY CONTROLLED SEMICONDUCTOR DEVICES WITH INTEGRAL THYRISTOR AND BRIDGING FET COMPONENTS

BACKGROUND OF THE INVENTION

Field of the Invention

The present invention relates to a semiconductor device, which comprises a semiconductor body with four layers of alternately P and N conducting types, which layers constitute a thyristor, the two outermost of said layers with adjacent layers forming emitter junctions.

SUMMARY OF THE INVENTION

The invention aims to provide a thyristor in which the ignition (either by means of a control electrode or optically) can be blocked with the help of an outer signal and, when being suitably dimensioned, the thyristor can also be extinguished with the same signal.

For this purpose, the device includes four layers of alternate P and N conductor types which constitute a thyristor, and the outermost layers of which form emitter junctions with adjacent layers. The semiconductor body includes an integrated field effect transistor part for bridging one of the emitter junctions. The source and drain of the field effect transistor include regions of the same conductivity type, one of which is the emitter layer adjacent to the bridged emitter junction while the other is a region ohmically connected to the layer adjacent to the emitter layer and of the same type of conductivity as the emitter layer.

BRIEF DESCRIPTION OF THESE DRAWINGS

The invention will be described in more detail with reference to the accompanying figures 1–16.

FIG. 1 shows a thyristor according to the invention and

FIG. 1a an equivalent diagram for the thyristor.

Figure 5:
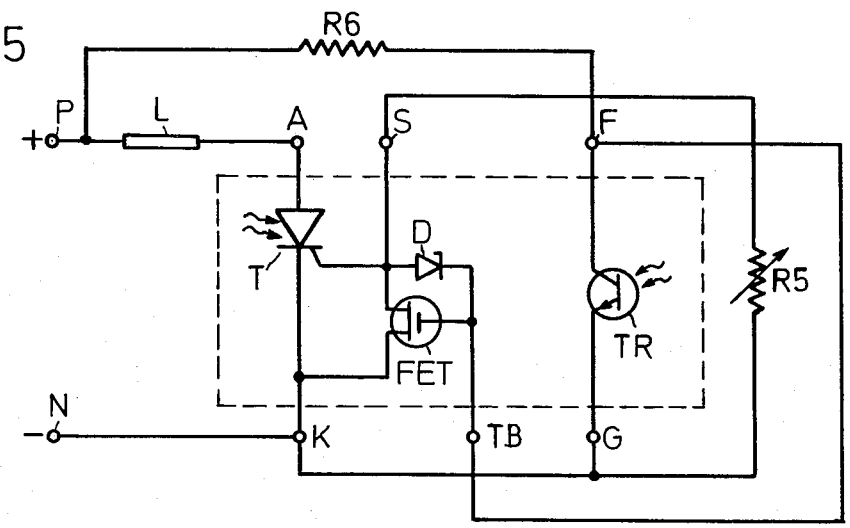
Figure 6:
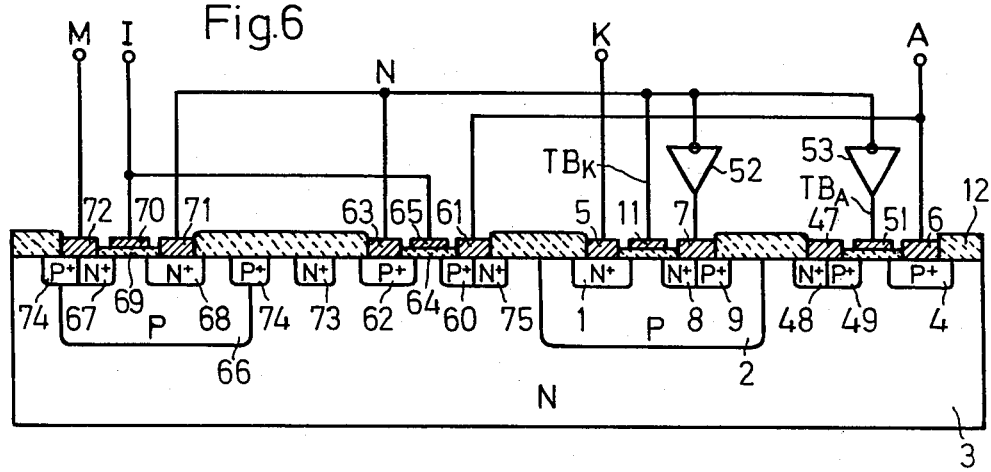

FIG. 5 a static DC relay with a thyristor according to the invention. FIG. 6 shows a thyristor according to the invention used as output stage for a complementary MOS transistor circuit, and FIG. 6a an equivalent diagram for the device according to FIG. 6.

DESCRIPTION OF THE PREFERRED EMBODIMENTS

Figure 1:
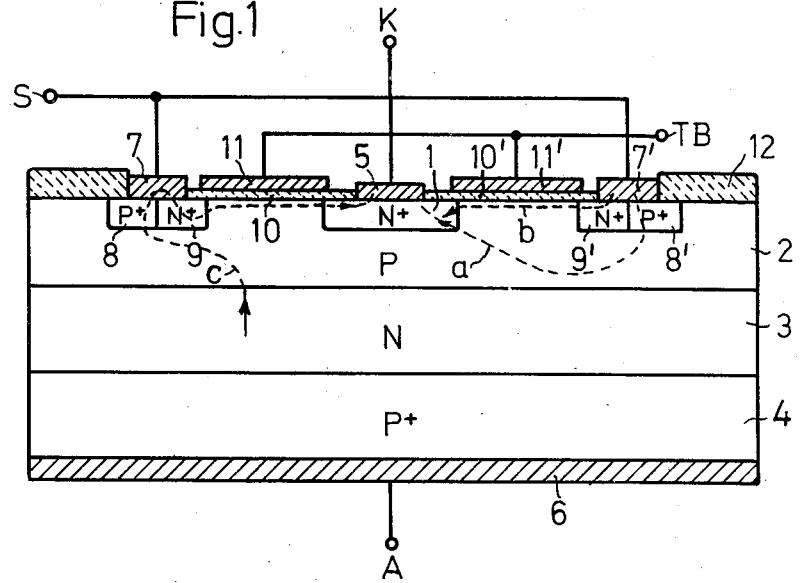

FIG. 1 shows a thyristor according to the invention. It consists of a semiconductor body of silicon, in which four layers 1–4 of alternately different conducting types are arranged. The N-conductor layer 1 constitutes the cathode emitter layer, the layer 2 constitutes the P base layer of the thyristor, the layer 3 its N base layer and the layer 4 its anode emitter layer. A metal contact 5 is arranged in ohmical contact with the layer 1 and is provided with a cathode lead K. In the same way a metal contact 6 is arranged on the layer 4 and provided with an anode lead A. For supplying ignition voltage to the thyristor over the ignition connection S, there are arranged metal contacts 7 and 7′. To provide a good ohmic contact between the metal layers and the underlying P layer, P+-conducting layers 8 and 8′ are arranged below the contacts 7 and 7′. Below the part of the contacts 7 and 7′ facing the cathode area 1, there are arranged N-conducting layers 9 and 9′. These two layers constitute collector areas of two field effect transistors formed in the semiconductor body. The cathode area 1 constitutes the emitter area in the field effect transistors. On top of the surface of the semiconductor body between the cathode contact 5 and the control contacts 7 and 7′ there are arranged thin silicon dioxide layers 10 and 10′. On top of these layers the metal contacts 11 and 11′ are arranged, and these contacts are connected to the connection TB to which the control voltage for the field effect transistor parts are supplied. These parts operate in a manner known per se so that, when no voltage or a negative voltage is applied to the connection TB, no current is able to flow between the collector area 9 and the emitter area 1 of, for example, the left-hand field effect transistor in the figure. On the other hand, if a control voltage is applied to the connection TB, which voltage is so great that it exceeds a certain threshold value, there is formed an N-conducting channel immediately below the silicon dioxide layer 10 in the surface of the semiconductor body. In this channel current is able to flow from the collector area 9 to the emitter area 1. The higher the voltage that is applied to the connection TB, the more charge is induced into the N-conducting channel and the lower resistance is offered by the field effect transistor for the current flowing between the emitter and the collector.

For ignition of the thyristor in FIG. 1 a positive voltage is applied to the control connection S in a known manner. If no voltage, or a control voltage lower than the threshold value, is applied to the blocking connection TB, the field effect transistors will become non-conducting, as mentioned. The control current which is supplied to the thyristor will then, in a normal manner, flow from the connection S across the metal contacts 7 and 7′ through the P+-conducting areas 8 and 8′ to the P base layer 2 and from there through the cathode emitter junction of the thyristor to the cathode layer 1, and from thence over the cathode contact 5 out through the cathode connection K. This current path is shown by a dashed line designated a at the righthand side of the figure. The current causes an injection of electrons from the cathode area 1 towards the blocking central junction and, if the control current is sufficiently high, it causes the thyristor to ignite in a known manner, that is, to change to conducting state.

Now, if, instead, a voltage is applied to the blocking connection TB which exceeds the above-mentioned threshold value, the field effect transistor parts will become conducting, i.e. a current is able to flow between the collector area 9–9′ of each field effect transistor part to its emitter area 1. If a control voltage is now applied to the control connection S, the control current will flow from the metal contacts 7 and 7′, respectively, to the N+-areas 9 and 9′, respectively, and from there through the N-conducting channels formed below the silicon dioxide layers 10 and 10′ to the cathode area 1. Therefrom the control current finally flows through the cathode contact 5 and out through the cathode connection K. The control current may in this case not give rise to any electron injection from the cathode area towards the central junction of the the collector, and therefore ignition of the thyristor cannot take place. The path of the control current from the control contact 7' to the cathode area 1 is shown for this case by the dashed line, designated b, on the right in FIG. 1. Thus, as described above, ignition of the thyristor can be effectively prevented by supplying an external signal to the blocking connection TB.

However, according to the invention the blocking connection TB can also be used to achieve turn-off of the thyristor. If, when the thyristor is in its conducting state, such a signal is supplied to the blocking connection TB that the field effect transistor parts are made conducting, the thyristor current will partly follow the dash-lined current path, designated c, on the left in FIG. 1. Part of the current of the thyristor will thus flow from the P-base area 2 to the P+-conducting area 8, through the control contact 7 to the N+-conducting area 9, and from there through the N-conducting channel of the field effect transistor part to the cathode area. This current path is purely ohmical, and by a suitable dimensioning and a suitable size of the control signal to the field effect transistors it may provide a low resistance. The normal current path for the thyristor current, i.e. directly from the P-base area through the cathode emitter junction to the cathode area 1, on the other hand, contains a voltage drop of the order of magnitude of 0.5-1 V. Therefore, by a suitable dimensioning, such a great part of the working current of the thyristor can be caused to flow through the current path designated c that the remaining part of the thyristor current will give rise to an unsatisfactory electron injection from the cathode area, and because of this the thyristor can no longer maintain the conducting condition but changes to its non-conducting condition. It is not possible to indicate an exact dimensioning, but strictly generally the rule applies that the closer to each other the cathode area 1 and the control electrode 7 lie, the less the resistance in the current path c and the more efficient the thyristor current will be shunted by the field effect transistor part past the injected cathode emitter junction, and it will then become possible to turn off even a relatively high working current in the thyristor.

The field effect transistor parts are shown in FIG. 1 as normally nonconducting field effect transistors. Of course, they may instead be designed as normally conducting field effect transistors, i.e. with a permanently N-conducting channel below the silicon dioxide layer. By applying a sufficiently high negative voltage to the blocking connection TB, the transistors will in that case change from their normally conducting state to nonconducting state. In this state, therefore, ignition and work in the conducting state are possible. If, on the other hand, no voltage or a low negative voltage is applied to the blocking connection TB, the field effect transistors in this case will be conducting, and ignition of a not already-ignited thyristor and an already ignited thyristor will be prevented will be turned off.

Figure 1A:
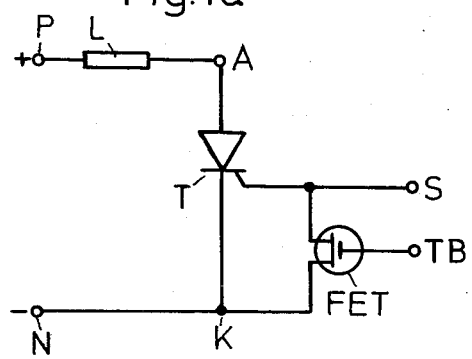

FIG. 1a shows an equivalent diagram of the semiconductor device according to FIG. 1 and how this semiconductor device can be connected into a load current circuit. The thyristor part of the semiconductor device is shown as a thyristor T which, in series with a load object L, is connected between a positive terminal P and a negative terminal N of a DC voltage source. The points of connection A, K, S and TB of the thyristor coincide with the connections shown in FIG. 1. The field effect transistor part FET of the semiconductor device operates as a field effect transistor, connected between the control connection S and the cathode connection K, with the control connection TB. With the design of the field effect transistor part shown in FIG. 1, a sufficiently high positive signal on TB will prevent ignition of the thyristor T and turn off the thyristor if it is in its conducting state.

The thyristor according to FIG. 1 can be made circular-symmetrical with the cathode area 1 and the cathode contact 5 at the centre, the areas 8, 9 and 10 and the contacts 7 and 11 forming rings concentric with the cathode area. Preferably, however, the areas 8 and 9 and the area 1 as well as the contacts 7, 11 and 5 are formed relatively thin and elongated. By elongated in this connection is meant that their dimension in a direction perpendicular to the paper is considerably greater than the distance between them and greater than their widths in the plane of the paper.

On that part of the upper surface of the silicon body which is not utilized for contacts and for field effect transistor parts, respectively, a protective silicon dioxide film is arranged in a manner known per se.

Figure 2A:
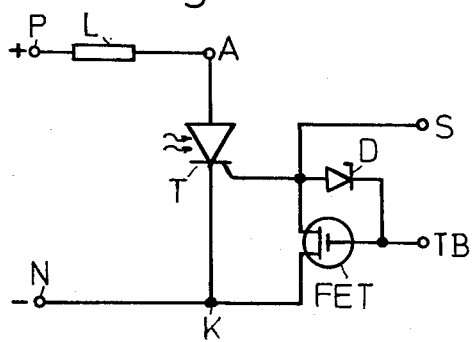
FIG. 2 shows a planar thyristor according to the invention, intended for optical ignition, and FIG. 2a its equivalent diagram.
Figure 2:
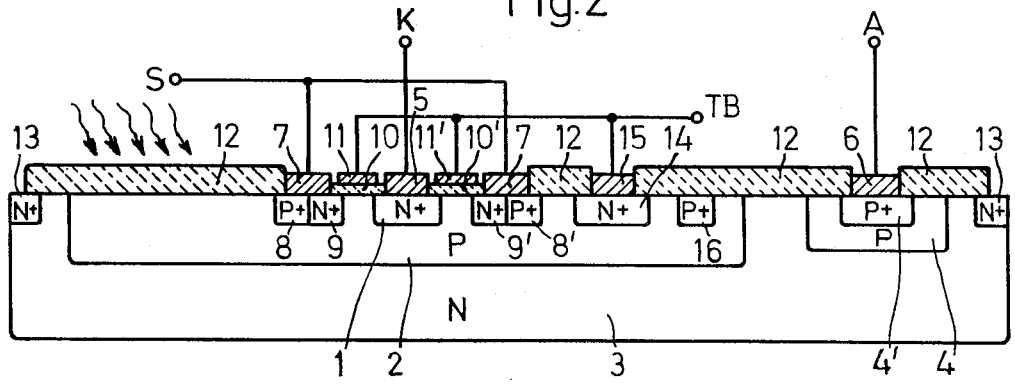

FIG. 2 shows an alternative embodiment of a semiconductor device according to the invention. It differs from the variant according to FIG. 1 in four respects:

First of all it is designed in planar technique and the anode area 4 is for this reason arranged on the upper surface of the disc. A more strongly P-doped area 4' is arranged in the area 4 below the anode contact 6 to provide a good ohmic connection.

Secondly, the thyristor is arranged to be ignited optically. The central junction (between layers 2 and 3) of the thyristor is for this reason extended somewhat to the left of the control contact 7. Light incident on this part of the thyristor will in a known manner generate charge carriers in the central junction which is blocking in the off-state, thus achieving ignition of the thyristor. By supplying a sufficiently high positive signal to the connection TB, the field effect transistor parts may be made conducting in the same way as has been described in connection with FIG. 1, the optically generated charge carrier current thus being shunted past the injecting cathode emitter junction, thus preventing ignition. In a corresponding manner as in FIG. 1, the thyristor can be caused to change from its conducting state to its non-conducting state by supplying a positive signal to the connection TB.

Thirdly, the semiconductor device is provided with a protective ring 13, which is conventional with planar components, said ring preventing leakage currents along the silicon surface.

Just like the thyristor in FIG. 1, the thyristor can be ignited with the help of a positive signal on the control connection S, if desired, of course, this connection may be omitted, and the thyristor can then only be ignited optically.

Fourthly, there is formed an N+-conducting area 14 in the semiconductor body, which area is provided with a metal contact 15 connected to TB. In case of normal (positive) voltage on the connection TB, the PN-junction between the layers 14 and 2 works in the reverse direction. The breakdown voltage for this junction is chosen so that it is lower than the maximally allowed voltage across the thin silicon dioxide layers 10 and 10'. In this way the PN junction 14-2 will operate as a protective diode which prevents detrimental overvoltages from occurring across the said silicon dioxide layers.

Further, a protective area 16, which is strongly P-doped, is applied between the protective diode and the anode part of the thyristor in a manner known per se.

FIG. 2a shows the equivalent diagram for the device according to FIG. 2 and how this device can be switched into a load current circuit. As will be seen, this diagram corresponds entirely with the diagram shown in FIG. 1a, with the exception that the protective diode D is connected between the control connection TB of the field effect transistor part and the control connection of the thyristor.

Figure 3:
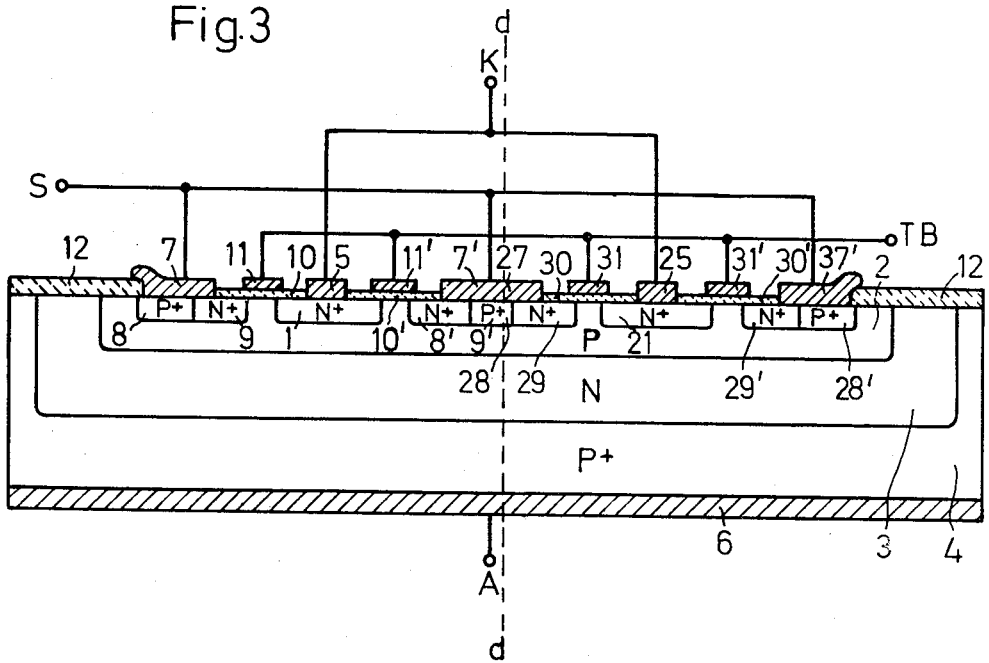
FIG. 3 shows a section through a planar thyristor according to the invention, which has several elongated cathode and control electrodes running in parallel with each other.

FIG. 3 shows one further embodiment of the invention. To obtain a sufficiently low resistance of the bridged current path through the field effect transistor part, it has proved suitable to divide the thyristor into a number of units working in parallel with each other. The device shown in FIG. 3 consists of two such parallel-working parts. The parts are separated by the dashed line d—d in the figure. The unit lying to the left of this line is identical with the one shown in FIG. 1 and has the same reference numerals as in said figure. The part lying to the right of the dashed line is identical with the lefthand part, but it has the reference numerals 21 to 31 inclusive instead of 1 to 11 inclusive. The P+-conducting area, which is designated 9' and 28, is common for both parts, like the metal contact 7'-27.

The areas 8, 9, 1, 8', 9', etc., arranged at the upper surface of the silicon body, as well as their metal contacts 7, 11, 5, 11', 7', etc., are designed as elongated strips with a large extension in a direction perpendicular to plane of the paper. By means of said division into several parallel-working units, the advantage is obtained as can be seen that the current paths b and c (see FIG. 1) will become as short as possible for a certain given area of the thyristor, and in this way the resistance of these current paths will become as low as possible, which makes the ability of the field effect transistor part to turn off the thyristor and to prevent its ignition, respectively, as high as possible.

The connections between the different metal contacts are only schematically shown in FIG. 3. As indicated in the figure, they may of course be made with the held of separate wires. Preferably, however they are made in a manner conventional within the planar technique, namely as metal layers located on the surface of the silicon body, which layers form a coherent unit with the metal contacts which are to be joined to each other and to an outer connection. FIG. 3 shows two parallel-working parts, but of course, depending on the size of the thyristor, an arbitrarily large number of parallel-working parts may be used. If desired, of course, also the anode contact A can be arranged on the upper surface of the silicon body in the same way as has been shown.

In a thyristor which has been tested in practice with a good result, the thickness of the silicon disc was 200 $\mu$m. The PN junction between layers 2 and 3 was located 15 $\mu$m below the upper surface of the disc, and the junction between layers 3 and 4 150 $\mu$m below the upper surface. The areas 8, 9, 1, etc., had a thickness of about 1.5 $\mu$m. The width of the areas 8 was 15 $\mu$m, of the area 9 about 20 $\mu$m, of the area 1 it was 30 $\mu$m and of the area 8' it was 20 $\mu$m. The area 9'-28 had a width of 10 $\mu$m. The distance between areas 9 and 1 was 7.5 $\mu$m, as well as the distance between the area 1 and the area 8'. The degree of doping of the layers designated P+ and N+ in the figure was about $10^{18}$–$10^{20}$ atoms/cm$^3$, of the N-layer 3 it was $10^{13}$–$10^{15}$ atoms/cm$^3$ and of the layer 2 it was $10^{16}$–$10^{17}$ atoms/cm$^3$. The thickness of the silicon dioxide layer 12 was 2 $\mu$m and of the silicon dioxide layer 10, 10', etc. 0.1 $\mu$m.

The metal contacts 7, 11, 5, etc., consisted of vaporized aluminium with a thickness of about 2 $\mu$m. The length in a direction perpendicular to the plane of the paper of the elongated areas 8, 9, 1, etc., was 250 $\mu$m. To block ignition of the thyristor there was required about 5–10 V on the input TB. It turned out that a load current of up to about 0.5 amperes could be turned off, using an applied voltage of about 40 V on the input TB.

The thyristor just described contained seven parallel-working parts, each one identical with one half of the device shown in FIG. 3.

Figure 4:
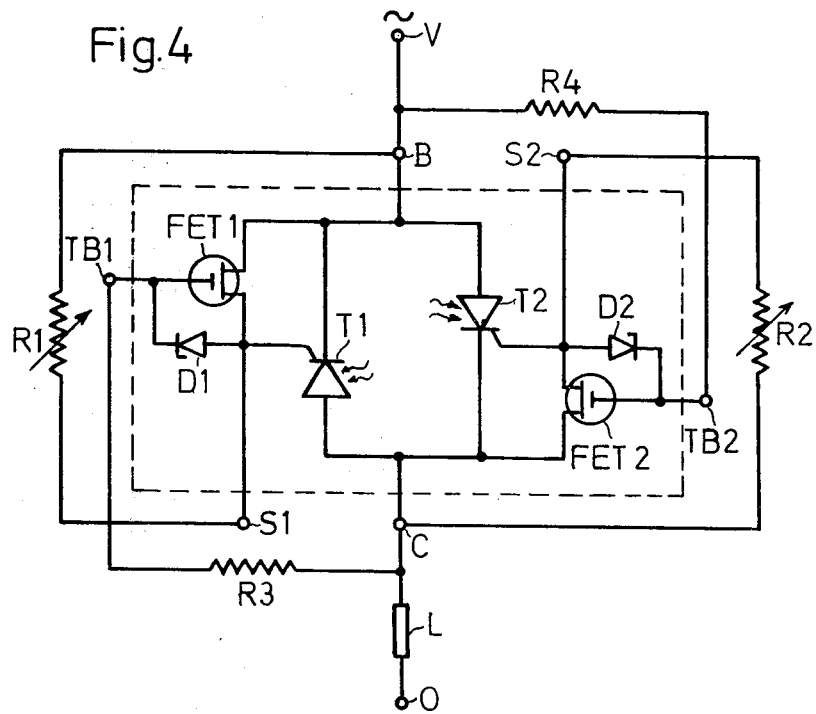
FIG. 4 shows a static AC relay with thyristors according to the invention.

FIG. 4 shows how a static AC relay can be formed with the help of a semiconductor device according to the invention. The relay comprises two thyristors T1 and T2, one for each conducting direction. The thyristors are anti-parallel-connected and in series with a load object L connected between the terminals V and O, across which there is applied an alternating voltage. In the same way as shown in FIGS. 2-2a, each thyristor is arranged for optical ignition and provided with a protective diode, D1 and D2, respectively. The semiconductor device can be designed in planar technique in one single silicon body or, if desired, in two parts, one for each thyristor. The device has six connections, B and C for the load current, S1 and S2 for a control signal, if any, and TB1 and TB2 for supplying blocking signals to the field effect transistor parts. Between B and S1 there is connected a variable resistor R1, and between TB1 and C a fixed resistor R3. Correspondingly, the resistors R2 and R4 are connected to the other half of the device. A light source, not shown, for example a separate light-emitting diode or a light-emitting diode mounted in the semiconductor capsule, is arranged to illuminate the thyristors for ignition with light of a suitable wavelength. The current to the light-emitting diode thus constitutes the input signal of the relay and through the optical coupling there is obtained a galvanic separation between input and output signals of the relay. During the halfperiod when the terminal V is positive, the connection TB2 is supplied with a positive signal through the resistor R4, which signal, by way of FET2, prevents ignition of the thyristor even if light for ignition is supplied to it. Only if the AC voltage across terminals V-O is near zero, the voltage to the field effect transistor will become so low that the bridging of the cathode emitter junction is ended and the thyristor T2 can be ignited. In this way the advantage is obtained that, irrespective of at which part of an alternating period light for ignition starts to be supplied, the thyristor will always ignite at a zero passage. Since the thyristor turns off at the zero passage which immediately succeeds the time when light stops being supplied to the thyristor, a number of whole half-periods will always be supplied to the load object. This leads to a considerable decrease of the interference which would otherwise be generated by the relay. By means of the resistor R2 the sensitivity of ignition of the thyristor is set. The operation of the thyristor T1 with its proper field effect transistor, protective diode and resistor is identical with the operation of the thyristor T2.

FIG. 5 shows a static DC relay arranged with the help of a semiconductor component according to the invention. The dash-lined square shows what can suitably be mounted in one single capsule, as in FIG. 4. The component thus formed has the six connections A, K, S, TB, F and G. The thyristor T lies, as in FIG. 1a, connected in series with the load object L between the terminals P and N, which are connected to a DC voltage source. A phototransistor TR formed in the semiconductor body has the connections F and G. A lightsource (not shown), for example a light-emitting diode, is arranged to emit light to the transistor TR and to the thyristor T. The resistor R5 is connected between the terminal S and the terminal G, and the resistor R6 between terminals P and F. The terminals F and TB are joined to each other as are G and K. The voltage to the above-mentioned light-emitting diode constitutes the input signal of the relay. When such a voltage is applied, the light-emitting diode emits light. This light hits the transistor TR which then acquires low resistance. The terminal F as well as the terminal TB then assume a low potential, and the field effect transistor part FET will thus become non-conducting. The ignition of the thyristor T will thus be possible and it takes place with the help of the light from the light-emitting diode which also hits the thyristor. When the input signal to the relay is removed, the light-emitting diode stops generating light. The transistor then acquires high resistance, the terminal F assumes a potential which is high, and the field effect transistor part FET then becomes conducting and bridges the cathode emitter junction of the thyristor, the thyristor thus being turned off. With the help of the resistor R5 the sensitivity of ignition of the thyristor can be set to a suitable value.

Figure 6A:
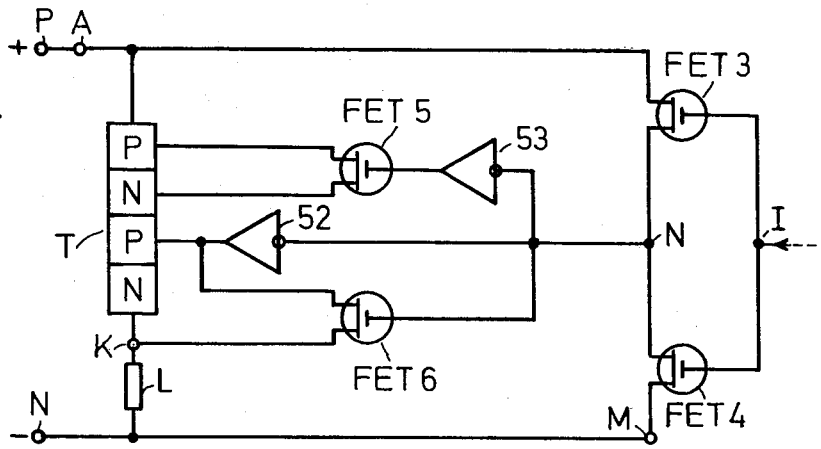

FIGS. 6 and 6a shows how a thyristor according to the invention can be arranged to constitute the output step from a complementary MOS transistor stage. In this way it will be possible in a simple manner strongly to increase the load capacity of a MOS circuit. The thyristor T consists of the layers 1, 2, 3 and 4 in FIG. 6 with the cathode connection 5 and the anode contact 6. The control connection 7 is arranged in ohmic connection with the layer 2 by way of the layer 9. The areas 1 and 8 form the collector and the emitter of the field effect transistor FET6, which, when a positive signal is supplied to the control connection TB$_K$, bridges the cathode emitter junction of the thyristor. A second field effect transistor part FET5 is arranged to bridge the anode emitter junction of the thyristor. It consists of the areas 49 and 4 and the control electrode 51. At a sufficiently high negative voltage on the electrode 51 with the connection TBA, there is obtained a P-conducting channel below the electrode and thus a conducting connection between areas 4 and 49. The metal contact 47 and the N+-conducting layer 48 provides an ohmic connection between the area 49 and the layer 3. The control electrode 7 is connected to the node N by way of an inverting amplifier 52, and the control electrode 51 of the field effect transistor FET5 is also connected to the same node by way of an inverting amplifier 53. These two amplifiers are suitably designed in a known manner to be integrated in one and the same semiconductor body as the rest of the device. A positive voltage on the node N causes FET6 and FET5 to become conducting and the control electrode 7 to become negative. Ignition of the thyristor is prevented and a conducting thyristor is extinguished. A negative voltage on the node N makes the field effect transistor parts FET5 and FET6 non-conducting and provides a positive control voltage to the control electrode 7 of the thyristor, the thyristor thus being ignited. The voltage on the node N is controlled by the field effect transistors FET3 and FET4, which in turn are controlled by the input signal to the connection I. FET3 consists of the layers 60 and 62 which constitute its collector and emitter, the metal contacts 61 and 63 and the control electrode 65 which is applied on top of the silicon dioxide layer 64. The N+-doped area 75 provides an ohmic connection between the contact 61 and the N layer 3. A negative input signal generates a P-conducting channel below the oxide layer 64 and makes the field effect transistor FET3 conducting. FET4 consists of the layers 67 and 68 with the contacts 72 and 71 and the control electrode 70 which is applied to the oxide layer 69. A positive signal on the connection I makes this field effect transistor conducting. The area 74 provides an ohmic contact between the electrode 72 and the layer 66, in which FET4 is arranged. The connection is connected in the manner shown in FIG. 6a between a positive terminal P and a negative terminal N with FET3 and FET4 in series and with the thyristor T and a load object L in series with the said terminals. A positive input signal to I makes FET3 non-conducting and FET4 conducting, the node N acquiring a negative voltage. This negative voltage makes FET5 and FET6 non-conducting and delivers, through the amplifier 52, a positive control current to the thyristor which thus ignites and delivers current to the load object. A negative input signal to I makes FET3 conducting and FET4 non-conducting, the node N thus acquiring a positive voltage. This positive voltage makes FET5 and FET6 conducting, both the emitter junctions of the thyristor thus being bridged and the thyristor turned off. With the help of a very small power, supplied to the input I, a relatively great load current can thus be controlled.

A thyristor according to the invention can be used in different convertor connections, known per se, for example a conventional bridge-connected convertor. In such a convertor the thyristor is turned off (commutated) at the end of each conducting interval, the thyristor current then decreasing towards zero and becoming negative during the time (reverse recovery time) that is required for removal of free charge carriers present in the thyristor (recovery charge). Thereafter off-state voltage can be applied to the thyristor without the risk of renewed ignition. By short-circuiting at least one of the emitter junctions of the thyristor at each commutation, as soon as the current has become negative (or possibly somewhat earlier), with the help of the field effect transistor, off-state voltage can be applied at an earlier stage than what would otherwise have been possible, without the risk of undesired ignition. In this way it will be possible, for example, to increase considerably the highest working frequency of the thyristor. During the on-state interval of the thyristor, the field effect transistor should in this case be non-conducting, that is, said emitter junction should not be short-circuited.

I claim:

1. Semiconductor device of the type controlled by an external input comprising a semiconductor body with four layers of alternately P and N conducting types, which layers constitute a thyristor including means responsive to said external input for controlling the thyristor, the two outermost of said layers forming emitter junctions with adjacent layers, the semiconductor body comprising an integrated metal oxide field effect transistor part bridging at least one of the emitter junctions for controlling ignition and turn-off of the thyristor, and having a source and a drain, the source and drain of the field effect transistor comprise regions of the same conductivity type, one of these regions comprising the emitter layer adjacent to the bridged emitter junction and the other region comprising a region ohmically connected to the layer adjacent to the emitter layer and of the same type of conductivity as the emitter layer.

2. Semiconductor device according to claim 1, in which the field effect transistor has a control electrode and which comprises a protective diode integrated in the semiconductor body for limiting the voltage between the control electrode of the field effect transistor and the semiconductor body.

3. Semiconductor device according to claim 1, which comprises an elongated emitter layer, an elongated control electrode arranged substantially parallel to said emitter layer, and in which the field effect transistor part is arranged between the electrode and the emitter layer.

4. Semiconductor device according to claim 3, which comprises a plurality of emitter layers of the same conductivity type and control electrodes arranged between the emitter layers, and in which between each emitter layer and adjacent control electrode there is a field effect transistor part.

5. Semiconductor device according to claim 1, in which the thyristor is provided with means for optical ignition.

6. Semiconductor device according to claim 1, which comprises an integrated complementary metal oxide transistor stage, and in which the thyristor has a control electrode for ignition of the thyristor, and which comprises means for supplying the output signal from the metal oxide transistor stage to the control electrodes of the thyristor and the field effect transistor part in such a way that, when the output signal lies on one side of a certain values, the control electrode of the thyristor is supplied with the ignition current and the bridging of the emitter junction is cancelled, and that when the output signal lies on the other side of said value the supply of ignition current is stopped and the emitter junction bridged.

7. Semiconductor device according to claim 1, in which field effect transistor parts for bridging the junctions are arranged at both emitter junctions.

* * * * *